(12) United States Patent
St. John

(10) Patent No.: US 6,692,664 B2
(45) Date of Patent: Feb. 17, 2004

(54) PRINTED WIRING BOARD CONDUCTIVE VIA HOLE FILLER HAVING METAL OXIDE REDUCING CAPABILITY

(75) Inventor: Frank St. John, Rockford, IL (US)

(73) Assignee: Methode Electronics, Inc., Chicago, IL (US)

( * ) Notice: Subject to any disclaimer, the term of this patent is extended or adjusted under 35 U.S.C. 154(b) by 263 days.

(21) Appl. No.: 09/792,722

(22) Filed: Feb. 26, 2001

(65) Prior Publication Data

US 2001/0009273 A1 Jul. 26, 2001

Related U.S. Application Data

(63) Continuation of application No. 09/458,500, filed on Dec. 9, 1999, now Pat. No. 6,337,037.

(51) Int. Cl.$^7$ ................................................ H01C 1/02
(52) U.S. Cl. ........................ 252/514; 252/500; 252/511; 252/520.3; 523/400; 523/443; 523/444; 523/458; 523/439
(58) Field of Search ................................. 252/514, 500, 252/511, 520.3; 523/400, 443, 444, 458, 439

(56) References Cited

U.S. PATENT DOCUMENTS 4,604,230 A  *  8/1986  Goswami et al. ............ 252/514
6,337,037 B1 *  1/2002  St. John ...................... 252/514

* cited by examiner

*Primary Examiner*—Yogendra N. Gupta
*Assistant Examiner*—Derrick Hamlin
(74) *Attorney, Agent, or Firm*—Blank Rome LLP

(57) ABSTRACT

A conductive via filler for printed wiring boards capable of reducing copper oxides and thereby eliminating a cleaning step in printed wiring board construction, the conductive via filler consisting essentially of silver flake, a resin, a hardener, and a titanate coupling compound. The filler or paste may further include one or more of a flexibilizer, a solvent, and/or an accelerator. It is a feature of the invention that extensive pre-cleaning of copper substrates is obviated.

15 Claims, 2 Drawing Sheets

PRINTED WIRING BOARD CONDUCTIVE VIA HOLE FILLER HAVING METAL OXIDE REDUCING CAPABILITY

This is a continuation of application having Ser. No. 09/458,500, filed on Dec. 9, 1999, U.S. Pat. 6,337,037.

FIELD OF THE INVENTION

The present invention relates generally to fillings for vias or holes in printed circuit boards, and more particularly, to a conductive paste for filling vias that is capable of reducing metal oxide present on the conductive substrate of printed circuit boards.

BACKGROUND OF THE INVENTION

Printed circuit boards (PCBs), also called printed wiring boards (PWBs), are used extensively in the computer hardware field for constructing electronic circuits. Chip carriers containing electronic components are placed on top of a PCB so that pins extending from the bottom of the chip carrier contact corresponding copper pads on the top surface of the PCB. The PCB usually contains several levels of circuitry in addition to a top layer. Each level of circuitry actually consists of two separate physical layers, a laminate layer and a pre-preg layer. The laminate layers contain electrical conductors on their surface. The pre-preg layers are typically a "B-staged" or partially cured fiberglass reinforced polymer. The laminate layers are imprinted or etched with copper pads and conductors that form a circuit pattern on each level of circuitry. Copper etchings provide the connections for electrical communication within each level of circuitry, however, another means is necessary for providing inter-level communication. This is generally accomplished by plated-through holes extending through and between several levels of circuitry.

A common procedure is to stack up all the layers of the PCB and to drill holes through the entire stack-up wherever an inter-level connection is desired. Therefore, even if an inter-level connection is needed from only one layer to the next, a hole is drilled through the entire stack-up. The hole is then electro-plated with copper during processing in order to groove an electrical conduction path through the hole. Unfortunately, it is common practice for copper conductors, which carry signals to and from other sources and destinations, to be routed around plated-through holes which were created for inter-level conductance to conductors on completely different circuit layers.

The use of plated-through holes leads to several other problems and disadvantages. First, copper plating, which takes a significant amount of time, must be performed in a separate step during the processing of the PCB. Also, copper has a different expansion rate when heated than the fiberglass polymer which is used in the pre-preg layer. As a result, plated-through holes are susceptible to cracking with temperature fluctuations.

The second artificial limit on hole size is the electroplating process. Small diameter holes are much more difficult to electroplate than larger ones. The costs of electroplating increase rapidly as hole diameter decreases. A typical PCB is a 50 mm pitch. The term 50 mm pitch refers to the distance between the center of adjacent conductors or adjacent pads, which is 50 mm. On a typical 50 mm pitch board, the copper pads that provide contacts for the pins of chip carriers are very small, approximately 20 mm by 35 mm. A circuit board designer is faced with the choice of high electroplating costs as well as using a very small diameter drill bit that will need to be replaced frequently, or finding some way to provide for larger holes. Typically a copper conductor is etched onto the PCB leading from copper pads to plated-through holes which are placed elsewhere on the PCB where there is enough room to place the holes on a 100 mm pitch. This is called fanout. A designer often makes a compromise in which only half of the contacts pads are fanned out to a 100 mil pitch. The fanned out holes typically have a 35 mm diameter. The remaining holes have diameters of approximately 18 mm and are drilled through every other pad, thereby providing holes on a 100 mm pitch. With fanout, not only do the larger holes take up more routing space than is necessary but the copper etches leading from the contact pads to the holes also occupy valuable routing area. In addition, fanout adds signal length which increases propagation delay as well as noise (cross-talk) vulnerability.

Another disadvantage of using larger holes is fewer etched conductors can be routed between holes. For instance, on a typical 50 mm pitch board, one or two conductor paths can be routed between holes, and this number might be increased to three or four copper conductors if not for the artificial limitation on hole diameter. Using fanout also limits the density at which surface mounted components may be placed because fanout holes occupy additional space on the top circuitry layer of the PCB.

Some prior art methods for improving the routing density on PCBs include the use of blind and buried vias. Blind vias are holes selectively drilled only in certain PCB layers and enclosed by the PCB stack-up lamination process step. Buried vias refer to those blind vias that do not connect to either the top or bottom circuitry level, i.e., that are buried in the stack-up. This process permits the movement of a plated-through hole from an undesirable position, but interconnection to the enclosed blind via still must be made by connecting the blind via to a plated-through hole. Also, the layers with the blind vias must be predrilled and pre-plated prior to the lamination step, thereby adding further complexity and cost to the fabrication process.

The typical processing of a PCB starts with the step of printing and etching a conductor pattern on each individual PCB laminate layer. The next step is to stack up the laminate layers with pre-preg layers in between each laminate layer. The pre-preg layers basically act as a bonding surface between the laminate layers. The plated-through holes are then drilled through the stack-up in preparation for copper electroplating. After the separate electroplating step, the board is cured.

Plated-through holes commonly receive pins or contacts from integrated circuits (ICs) or chip carriers that may be soldered within the plated-through hole in order to electrically connect an element to the PCB. The process of forming plated-through holes commonly involves electroless copper plating of the printed circuit board and the holes or vias in the printed circuit board. This process is expensive and only coats the vias inside surface, leaving behind a hole or via in the printed circuit board. In applications where it is not desired to insert a contact or pin within the plated-through hole and only to use the hole to carry electrical signals from one side of the board to the other side of the board, it is desirable to completely fill the hole so that a smooth planar surface remains on both sides of the printed circuit board.

Polymer thick film (PTF) via plug materials prevent the entrapment and bleed-through of material in plated-through holes, as well as increase surface area, thermal management, and padless via technology for BGA and surface mount technology. Conductive PTF materials consist of metallic particles, an organic vehicle to bind them together and promote adhesion of the paste to the substrate, and a volatile solvent that is removed during a cure or drying step.

Choice of metal filler is a major consideration. The conductivity of copper-based polymer thick film conductors is often unstable and deteriorates with age. Silver, on the other hand, has a good reliability record in polymer thick films in regard to conductivity. Silver migration, however, needs to be avoided in applications. To reduce cost, silver plated copper powder can be used, which can reduce conductivity compared to pure silver particles.

A significant problem in the use of via fillers is formation of metal oxides. Metal-oxides can form between the via filler and the etchings on laminate boards carrying signals to PCB components. These metal-oxides, such as copper oxide, reduces electrical conductivity. These metal oxides appear as a ring around the via filler at the interface between the filler material and the copper substrate of the PCB.

A solution has been to use fluxing agents to remove metal oxides and promote wetting of the metal filler by the molten solder. This use is particularly important because metal filler typically consists of many irregularly shaped particles that have substantial surface areas which must be cleaned of metal oxides. Weak fluxing agents do not clean the surface areas sufficiently. Therefore, strong fluxing or activating agents are necessary and yet these are harmful to the curing process, thus hampering adhesion and long term stability. Moreover, strong fluxing agents are acids, and while they increase conductivity, they also degrade the composition once cured. Furthermore, the corrosive acidity remains around after the curing process and can cause potential harm to other components on the PCB.

Another method of reducing metal oxide formation has been to pre-coat the metal particles with solder which also increases wetting of metal particles by solder when molten. This process increases product costs with inconsistent performance gains.

Accordingly, there is a need for a via filler that is inexpensive to produce and integrate into the PCB manufacturing process that reduces or eliminates metal-oxides while maintaining good conductivity and long term performance.

OBJECTS AND SUMMARY OF THE INVENTION

An object of the present invention is eliminate the cleaning process step required in the prior art to remove metal-oxides during manufacture of printed circuit boards.

A second object of the invention is to eliminate plated-though holes or vias.

Another object of the invention is to increase available real estate on PCBs by eliminating fan out or dog bone designs.

A further object of the invention is to reduce or eliminate non-functional vias and thus increase routing area on a PCB.

An additional object of the invention is to reduce the size and layers of PCBs by increasing available real estate on each circuit layer.

Another object of the present invention is to reduce the size of vias by eliminating the need for plate-through holes or vias.

Moreover, an object of the present invention is to provide a conductive filler that does not use copper or an alloy as a conductive component of the filler to reduce cost and improve efficiency.

According to the present invention, an electrically conductive composition is provided consisting essentially of silver, a resin, titanate coupling compound, and a hardener. The filler or paste may further include one or more of a flexibilizer, a solvent, and/or an accelerator.

It is a feature of the invention that extensive pre-cleaning of copper substrates is obviated. Whereas the purpose of such cleaning is to remove copper oxides from substrates prior to deposition of a conductive composition, materials for doing this are incorporated into the composition of the present invention.

DETAILED DESCRIPTION OF THE PREFERRED EMBODIMENTS

Figure 1:
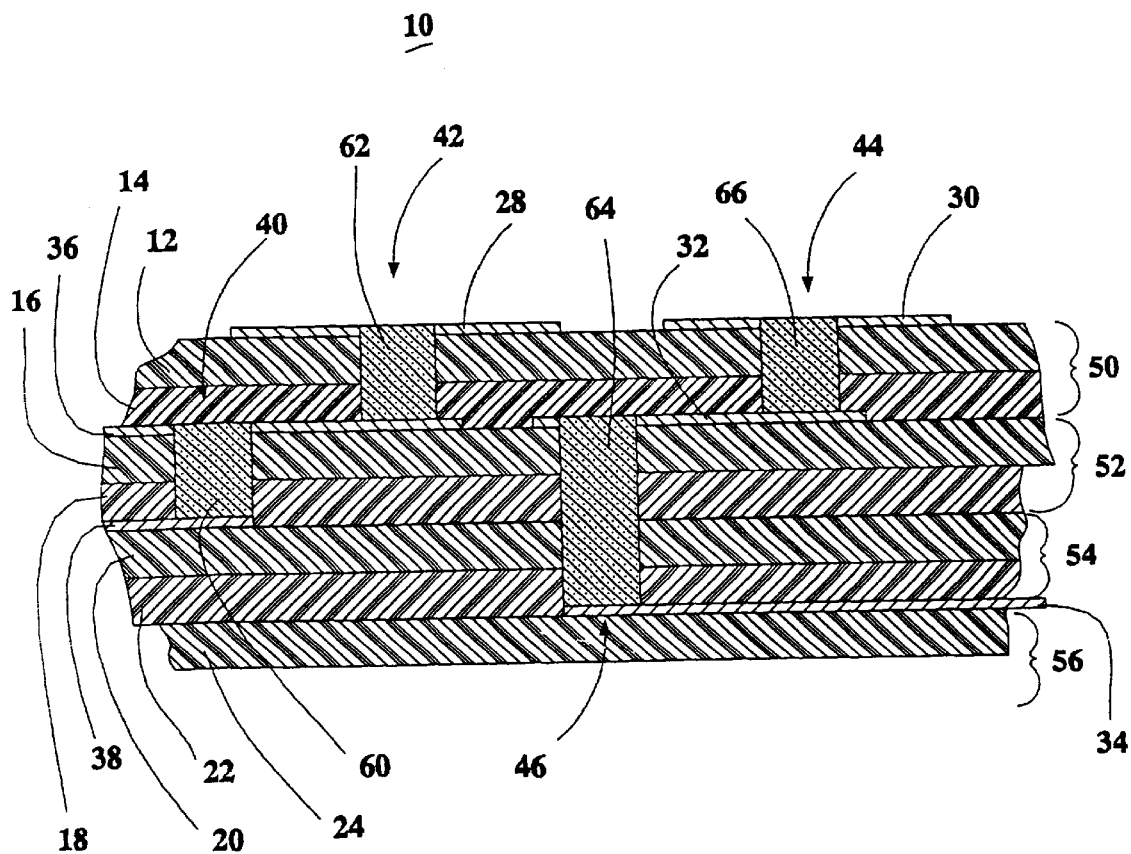
FIG. 1 is a cross-sectional view of a printed circuit board configured in accordance with the present invention.

Referring now to the drawings, FIG. 1 shows a cross-sectional view of a section of a printed wiring board (PCB) 10 embodying the present invention. The illustrated PCB has seven layers 12, 14, 16, 18, 20, 22 and 24. Of course, the invention can be incorporated into a PCB having a greater or a smaller number of layers. Each level of circuitry 50, 52, 54 and 56 is comprised of two layers, a laminate and a pre-preg. In the particular embodiment shown in FIG. 1, the laminate layers 12, 16, 20 and 24 are imprinted with circuit patterns. The pre-preg layers 14, 18 and 22 are displaced between the laminate layers in order to electrically isolate the laminate layers from each other and to bind the laminate layers together. Pre-preg is typically a B staged or partially cured fiberglass reinforced polymer. Copper conductors or etchings 28, 30, 32, 34, 36 and 38 are imprinted on the respective laminate layers and carry electrical signals from an electrical source to an electrical destination within a given layer. The holes or vias 40, 42, 44, and 46 carry electrical signals from circuit layer to circuit layer. The vias are basically holes which are either punched or drilled through a layer.

In accordance with the present invention, each via 40, 42, 44, 46 is filled with a conductive paste or via filler 60, 62, 64, 66 in order to provide a very low resistance pathway between different circuit layers. Procedures for producing the conductive paste or filler are as follows:

EXAMPLE 1

A composition was made as follows: 89 grams of Epon® 862 epoxy resin from Shell Oil Company was weighed into a container. To this was added 5 grams of Heloxy® 505 from Shell Oil Company and 6 grams of Amicure® CG-1400 from Air Products and Chemicals, Inc. After hand stirring the mixture was passed through a 3-roll mill for further dispersion.

EXAMPLE 2

A composition was made as follows: 84 grams of Epon® 862 epoxy resin from Shell Oil Company was weighed into a container. To this was added 10 grams of Heloxy® CG-1400 from Air Products and Chemicals, Inc. After hand-stirring the mixture was passed through a 3-roll mill for further dispersion.

EXAMPLE 3

A composition was made as follows: 12 grams of paste from Example 1 were added to 4 grams of isophorone, 0.5 grams of LICA® 38, AND 83.5 grams of silver flake. After hand-stirring the mixture was passed through a 3-roll mill for further dispersion. A portion of a preoxidized copper sheet was covered with this paste and placed in an oven at 110 degrees Centigrade for 10 minutes. The paste was then removed to expose the surface of the copper underneath. It was found that the golden oxidation color was changed to a reddish color indicating some oxidation had been removed.

EXAMPLE 4

A composition was made as follows: 12 grams of paste from Example 2 were added to 4 grams of isophorone, 0.5 grams of LICA® 38, and 83.5 grams of silver flake. After hand-stirring, the mixture was passed through a 3-roll mill for further dispersion. A portion of a preoxidized copper sheet was covered with this paste and placed in an oven at 110 degrees Centigrade for 10 minutes. The paste was then removed to expose the surface of the copper underneath. It was found that the golden oxidation color was changed to a reddish color indicating some oxidation had been removed.

EXAMPLE 5

A composition was made as follows: 12 grams of paste from Example 1 were added to 4 grams of isophorone, 0.5 grams of LICA® 09, and 83.5 grams of silver flake. After hand-stirring the mixture was passed through a 3-roll mill for further dispersion. A portion of a preoxidized copper sheet was covered with this paste and placed in an oven at 110 degrees Centigrade for 10 minutes. The paste was then removed to exposed the surface of the copper underneath. It was found that the golden oxidation color was changed to a pink color indicating that the oxidation had been substantially removed.

DEFINITIONS

The solvent maybe isophorone. Amicure® CG-1400 is one curing agent. The accelerator may be Amicure® UR2T curing agent. The resin may be Shell Epon® resin 828 (bisphenol A/Epichlorohydrin resin). The isophorone evaporates to cause the metal filler, for example silver, to come together so that the silver flakes are tightly packed in a more conductive composition that without the solvent isophorone.

The coupling compound or organo-titanate may be a monoalkoxy titanate or a neoalkoxy titanate. The titanate may be a neoalkoxy titanate such as Ken-React® LICA® 09 having chemical name neopentyl(diallyl) oxy, tri(dodecyl) benzene-sulfonyl titanate or Ken-React® LICA® 38 having chemical name neopentyl(diallyl)oxy,tri(dioctyl)pyro-phosphato titanate. Titanates having a low pH were found to have better metal oxide reducing capability.

Amicure® CG 1400 refers to a product made by Air Products and Chemicals, 7201 Hamilton Blvd, Allentown, Pa. 18195 (610) 481–4911 and containing over 99% cyanoguanidine and less than one percent silica.

Amicure® UR2T refers to a urea-type compound.

EPON® 828 refers to bisphenol A/epichlorohydrin resin (CAS number 25068-36-6), by Shell Corporation.

Heloxy 505® refers to the product made by Shell corporation, epichlorohydrin castor oil based epoxy resin having chemical name aliphatic triglyceride triglycidyl ether and including 99.9% epichlorohydrin castor oil based epoxy resin and less than 0.05% epichlorohydrin.

Shell 862 refers to EPON® 862 Epoxy Bisphenol F Resin (Shell Corp. Houston Tex.).

The organo-titanate may be in a monoalkoxy or neoalkoxy form. It was found that addition of a neoalkoxy titanate such as Ken-React® LICA® 09 having chemical name neopentyl(diallyl) oxy, tri(dodecyl)benzene-sulfonyl titanate or Ken-React® LICA® 38 having chemical name neopentyl(diallyl)oxy,tri(dioctyl)pyro-phosphato titanate could be used to make an electrically conductive composition which is improved in that it reduces or removes copper oxides from the interface between a via hole filler and a printed wiring board (PWB). The copper oxide reduction occurs within approximately 10 minutes of applying the invented composition to oxidized copper.

The hardener is at least one hardener selected from the group consisting of amine hardeners, urea hardeners, acid anhydride hardeners, and aromatic amine hardeners.

It is understood that other curing agents, hardeners, resins, flexibilizers, and solvents may be used in greater or lesser concentrations without departing from the invention.

The process step of filling a via with the conductive paste may be carried out in a number of different ways. A screen printing technique may be employed. Alternately, a foil may be provided that is etched or drilled in a proper pattern with the conductive paste (adhesive) being extruded through the foil with the conductive material passing into the holes in the proper pattern.

As shown in FIG. 1, the vias 40, 42, 44, 46 are not drilled (using a drill bit or a laser) completely through all the layers as in the prior art. In the present invention, it is necessary to drill the via only through the number of layers that separate the layers containing the two copper etching that are to be electrically connected. For example, if it is desired that an electrical signal traveling on copper conductor 28 on top of the PCB 10 is to be communicated to the copper conductor 34 on the second circuit layer 52, then the via 44 only needs to be drilled through the first laminate 12 and the pre-preg layer 14. Alternatively, as shown at via 46, if an electrical signal on the second circuitry layer 52 (consisting of laminate layer 16 and pre-preg layer 18) is to be transferred to the fourth circuitry layer 56 (only laminate layer 24 is shown), then the via 46 is drilled through two laminate layers 16, 20 and two pre-preg layers 18, 22.

Figure 2A:
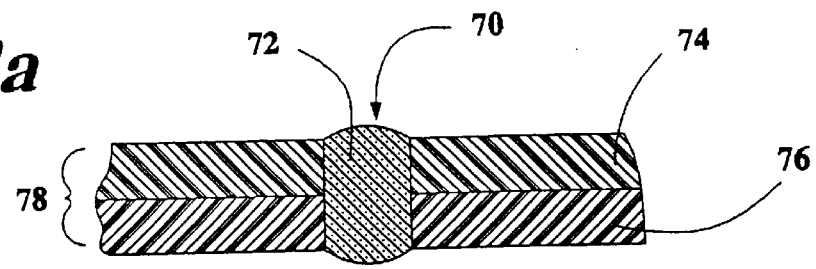
FIG. 2a is a cross-sectional view of a via filler configured in accordance with the present invention, wherein the via is neither plated-through nor in contact with a copper conductor.

FIGS. 2a–2d illustrate different types of vias configured in accordance with the present invention. FIGS. 2a–2d are all cross-sectional views of vias in printed circuit boards. FIG. 2a shows a cross-sectional view of a via 70 filled with conductive filler 72 in accordance with present invention. The via 70 passed through layers 74, 76 of circuit layer 78. The via 70 in this embodiment is not plated-through. Furthermore, neither the via 70 nor the conductive filler 72 is in contact with a copper conductor.

Figure 2B:
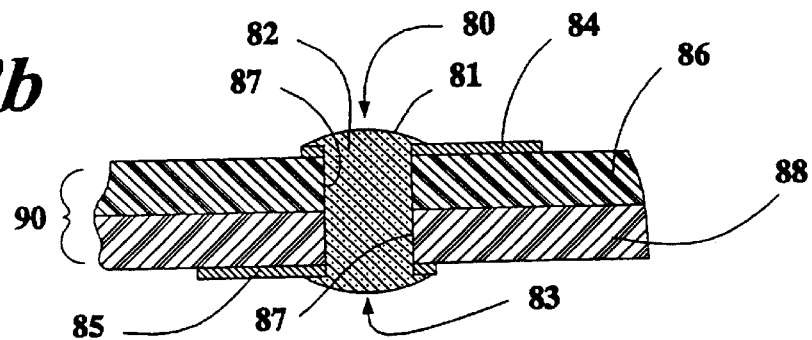
FIG. 2b is a cross-sectional view of a via filler configured in accordance with the present invention, wherein the via is not plated-through but is in contact with a copper conductor.

FIG. 2b illustrates a via 80 that is filled with a conductive filler 82. The via 80 passes through layers 86, 88 of circuit layer 90. The via 80 in this embodiment is not plated-through. However, the conductive filler 82 of the via 80 is in contact with copper conductors 84 and 85. Electrical signals on copper conductor 84 are solely communicated to copper conductor 85 by the conductive filler 82. No plated through holes are used to pass electrical signals between copper conductors 84 and 85.

Figure 2C:
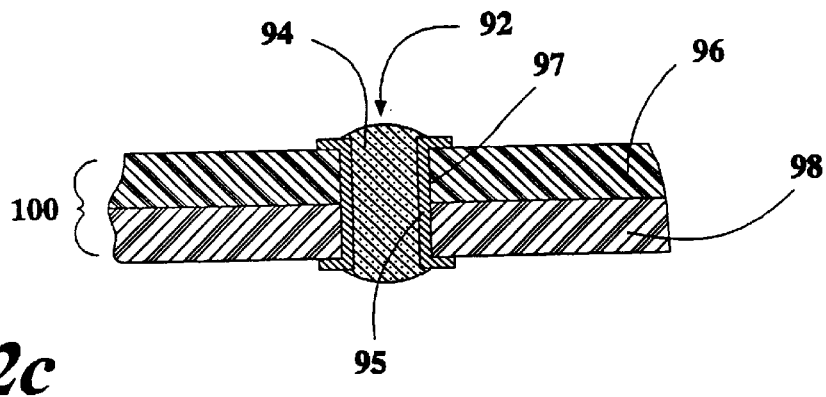
FIG. 2c is a cross-sectional view of a via filler configured in accordance with the present invention, wherein the via is plated-through but is not in contact with a copper conductor.

FIG. 2c illustrates a via 92 that is filled with a conductive filler 94. The via 92 passes through layers 96, 98 of circuit layer 100. The via 92 in this embodiment is plated-through with a copper layer 95 on the side walls 97 of the via 92. The conductive filler 94 of the via 92 is not in contact with any copper conductors on the surfaces of layers 96, 98.

Figure 2D:
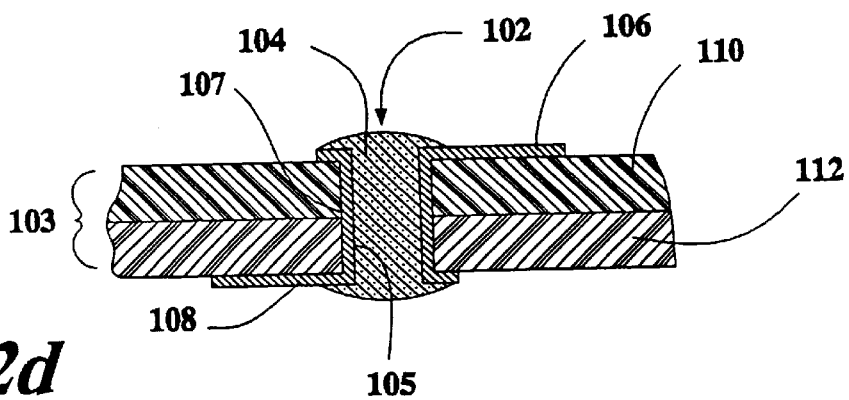
FIG. 2d is a cross-sectional view of a via filler configured in accordance with the present invention, wherein the via is both plated-through and is in contact with a copper conductor.

FIG. 2d illustrates a via 102 that is filled with a conductive filler 104. The via 102 passes through layers 110 and 112 of circuit layer 103. The via 102 in this embodiment is plated-through with a copper layer 105 on the side walls 107 of the via 102. The plated-through copper side walls 105 are in contact with copper conductors 106 and 108. Electrical signals on copper conductor 106 are communicated to copper conductor 108 by the conductive filler 104 and the side plated walls 105. The side plated walls 105 shown in this embodiment is unnecessary given the presence of the conductive filler 104 which communicates electrical signals between copper conductors 106 and 108.

Since vias constructed in accordance with the present invention can be smaller, they may be drilled or punched directly through a contact pad or copper conductor on an uppermost circuit layer, thus eliminating the need for fanout. Eliminating fanout for surface mounted components enables electrical components to be placed closer together, thereby increasing a PCB's component density.

Electro-plating, which imposes a limit on the size of a via, is eliminated by the present invention. Whereas holes having diameters of approximately 35 mm were typical of the prior art printed wiring boards and holes having 16–25 mm diameters were considered small, the present invention allows holes to have diameters of less than 1 mm. The preferred hole size using this invention is about 0.3 mm.

The use of a conductive via filler as an inter level conductor provides further advantages over conventional plated-through vias. Although copper plating provides satisfactory inter-level connections when using through holes, the use of that technology for inter-layer conducting in the blind vias and buried vias of the present invention provides unsatisfactory electrical connections. In the prior art, all the layers in a given circuit board are stacked up and the through holes are electroplated in one continuous process. In the present invention, the vias in each level of circuitry (constituting a laminate and pre-preg layer) are drilled and filled with epoxy separately due to the fact that vias do not run contiguously through all the layers. During processing, after the vias are drilled and filled, all the printed wiring layers are stacked up, pressed together and laminated. If the vias are electroplated, the contacts between contiguous vias or between the vias and the conductors may become corroded and/or placed imperfectly so that the contact becomes weak, creating noise or completely failing. The use of conductor filled epoxy avoids this fabrication problem.

Using the present invention, the processing of a printed wiring board involves the following steps. The first step is to print and etch the conductor pattern on each individual laminate layer. Next, via inter-connection holes are drilled (or punched) in the laminate layer and corresponding pre-preg layer. At this point, the via holes are filled with the conductor filled paste such that there is slightly more epoxy than is necessary to completely fill the hole. The slight overfilling of the hole creates a slight "bump" 81 and 83 (FIG. 2b) at the top and bottom, respectively, of the hole 80.

The epoxy will remain in the hole due to its natural adhesion to the side walls 87 of the hole 80 as well as its viscosity. A typical conductor-filled epoxy which would be ideal for application in this invention has a viscosity of approximately 100,000 centipoise (cps.). Such a viscosity would be more than adequate for holding the epoxy in place.

Prior to stacking the circuit boards, it is preferred to partially cure the epoxy so that it is maintained properly in the interconnecting hole. In the process of fabrication the next step is to stack all the printed wiring board layers and pre-preg layers in a stack-up and laminate. When the printed wiring board layers are pressed together in the stack-up laminate procedure, the "bumps" of epoxy are squeezed under pressure and spread out to bond the adjacent layers. This creates an extremely intimate and faithful connection between the epoxy and the copper etching of the adjacent layers. Since the epoxy bonds to the adjacent layer, there is little possibility of corrosion destroying the inter-layer electrical connection.

The stacking and laminating procedure involves the application of heat for curing the layers, particularly the bonding pre-preg layers. The application of heat also cures the epoxy as the epoxy segments are maintained in intimate contact. In this regard the provision of the bump is very important in maintaining proper contact throughout the epoxy bridge.

Other advantages over the prior art are also gained by using the present invention. For instance, the copper plating process consumes a large amount of time relative to the amount of time that it takes to fill the holes with conductor filled epoxy. Plated-through holes are also susceptible to cracking with temperature fluctuations, due to the dissimilar material expansion rates of copper, and the fiberglass polymer used in the pre-preg. It should be noted at this point that the via fill paste should be chosen to be compatible with the pre-preg layer in terms of curing-cycle time and temperature, in order to avoid the same susceptibility to cracking.

A further advantage of the present invention is that a punch may be used to create the vias as opposed to a drill or a laser. Since the thickness that must be punched through is much less than in the case of plated-through holes, a high-speed punch bit can be used instead of a drill or a laser, to create the holes. The cost of manufacturing a punch bit is significantly less than the cost of manufacturing a drill bit of the same diameter. This is because the surface of a drill bit must be contoured whereas a punch bit need have only a straight, plate surface.

It is to be understood that the foregoing description is merely a disclosure of particular embodiments and is no way intended to limit the scope of the invention. Several possible alterations and modifications will be apparent to those skilled in the art. For instance, the thickness of the printed wiring board can be decreased by eliminating the laminate layers and printing and etching the conductor pattern directly on the pre-preg layers. Further, in some applications where via resistance is critical, it may be desirable to copper-plate the vias and then fill them with conductor filled epoxy. Other possible modifications will be apparent to those skilled in the art as all to be defined by the following claims:

I claim as my invention:

1. An electrically conductive composition for filling via holes in a printed circuit board, consisting essentially of:
   silver;
   a hardener;
   a resin; and a titanate coupling compound for removing copper oxides, wherein the titanate is selected from the group consisting of monoalkoxy titanate and neoalkoxy titanate.

2. The composition of claim 1, wherein the neoalkoxy titanate is neopentyl (diallyl) oxy, tri (dioctyl) pyrophosphato titanate.

3. The composition of claim 1, wherein the neoalkoxy titanate is neopentyl (diallyl) oxy, tri (dodecyl) benzenesulfonyl titanate.

4. The composition of claim 1, wherein the hardener is at least one hardener selected from the group consisting of amine hardeners, urea hardeners, acid anhydride hardeners, and aromatic amine hardeners.

5. The composition of claim 1, further consisting essentially of one or more of a flexibilizer, a solvent a coupling compound, and an accelerator.

6. The composition of claim 1, wherein the silver consisting essentially of silver flake.

7. The composition of claim 1, further consisting essentially of a flexibilizer.

8. The composition of claim 1, further consisting essentially of a solvent.

9. The composition of claim 1, further consisting essentially of an accelerator.

10. The composition of claim 1, wherein the mixture is mechanically stirred.

11. The composition of claim 10, wherein the compound is heated after being mechanically stirred.

12. The composition of claim 1, wherein the mixture is passed through a roll mill.

13. The composition of claim 12, wherein the mixture is heated after being passed through a roll mill.

14. The composition of claim 1, wherein the composition is formed by heating the mixture at a temperature in excess of 100 degrees Centigrade.

15. The composition of claim 14, wherein the composition is heated approximately 10 minutes.

* * * * *